United States Patent
Nicholson

(10) Patent No.: US 6,580,960 B1
(45) Date of Patent: Jun. 17, 2003

(54) SYSTEM AND METHOD FOR FINDING AN OPERATION/TOOL COMBINATION THAT CAUSES INTEGRATED FAILURE IN A SEMICONDUCTOR FABRICATION FACILITY

(75) Inventor: Mark Nicholson, Stocksfield (GB)

(73) Assignees: ProMos Technologies, Inc., Hsinchu (TW); Mosel Vitelic, Inc., Hsinchu (TW); Infineon Technologies AG., M chen (DE)

( * ) Notice: Subject to any disclaimer, the term of this patent is extended or adjusted under 35 U.S.C. 154(b) by 567 days.

(21) Appl. No.: 09/602,378

(22) Filed: Jun. 22, 2000

(51) Int. Cl.$^7$ ................................................ G06F 19/00
(52) U.S. Cl. ........................ 700/121; 700/108; 438/14; 716/4
(58) Field of Search .................... 700/108–110, 121, 700/117, 111; 716/4; 438/14, 17, 5; 702/35, 187, 182–185

(56) References Cited

U.S. PATENT DOCUMENTS 5,716,856 A * 2/1998 Lin et al. ....................... 438/14
5,761,065 A * 6/1998 Kittler et al. ................. 700/117
5,963,881 A * 10/1999 Kahn et al. ..................... 702/35
6,496,958 B1 * 12/2002 Ott et al. ......................... 716/4
6,507,933 B1 * 1/2003 Kirsch et al. ................... 716/4

* cited by examiner

*Primary Examiner*—Leo Picard
*Assistant Examiner*—Steven R. Garland
(74) *Attorney, Agent, or Firm*—Blakely, Sokoloff, Taylor & Zafman

(57) ABSTRACT

A system and method for finding operation/tool's combination which causes the integration failure in a semiconductor fabrication facility is disclosed. It comprises the steps of generating a candidate operation/tool list by selecting the operation/tool's that are more likely to cause said failure. Assign a weight value to each lot in the lot list for each operatioon/tool in said candidate operation/tool list, the weight value being a predetermined positive value for a bad lot, and a negative value for a good lot. Then select any pair of operation/tool's from said candidate operation/tool list and calculate a peak combination cumulative value for that pair of operation/tool's. Rank each pair of operation/tool's according to their corresponding peak combination cumulative values. It is determined the pair of operation/tool's with the greatest peak combination cumulative value the most likely to cause said failure.

15 Claims, 2 Drawing Sheets

SYSTEM AND METHOD FOR FINDING AN OPERATION/TOOL COMBINATION THAT CAUSES INTEGRATED FAILURE IN A SEMICONDUCTOR FABRICATION FACILITY

RELATED APPLICATION

This application is related to U.S. patent application Ser. No. 09/577,695 filed May 22, 2000, currently pending.

FIELD OF THE INVENTION

This invention relates to semiconductor manufacturing processes, and more particularly, to an improved system and method for finding the operation/tool combination that causes integrated failure in a fabrication facility used in processing semiconductor wafers.

BACKGROUND OF THE INVENTION

In order to produce a particular circuitry on a semiconductor wafer, the wafer has to pass through several processing steps. These processing steps involve depositing material layers and forming patterns on these material layers by photolithography, ion implantation, and thermal annealing, etc. Each of these processing steps must be performed perfectly on a wafer in order to produce functional circuitry. Each of the processing steps is monitored to detect errors.

To ensure that the circuitry be fully functional, in-line testers conduct electrical and/or physical tests on the wafers after certain key process steps, and the test data is sent to various diagnostic tools to determine whether any errors occurred in that particular process. For example, after a series of implantation process are performed, the wafer is examined to see if any defects have formed, or if the number of defects has exceeded a threshold level. If a defect is detected, or if the number of defects exceeds a threshold level, an operator adjusts the process immediately to ensure proper operation. After a wafer has gone through all the required processing steps, more comprehensive electrical and/or physical tests are then performed on each die on the wafer to ensure that the circuitry is functional. If defects are detected, then operators trace the processing history of the wafer and determine which process went wrong and generated the defects.

Methods have been developed in the past to determine the defective process. One method is the process-based commonality analysis. Because a semiconductor fab typically has several production lines running simultaneously, an operator may locate the defective process by finding a common process or tool that all of the defective wafers have passed through. Suppose wafers having high defective rates all went through a particular ion-implantation process, and wafers which did not go through that particular ion-implantation process had very few defects, then it is likely that the ion-implantation process is the source of the defects. By finding the common processes for which the defective wafers have gone through, the process-based commonality analysis provides a way of finding faulty processes.

However, some processes may have multiple tools. Moreover, some tools may be involved in more than one process. The commonality technique helps in showing the percentage of defective wafers that were processed by each tool for each process. In practical experience, the inventor found some occasion that being non-defective for the single tool itself, the percentage of defective wafers run through that tool is incredibly high. This kind of failure is a consequence of two cascaded tools being in an odd condition that does not fall into the common process window. The failure caused by a two operation/tool combination is more complicated than that caused by single tool or process, and has not been addressed before. Thus, an effective system and method, dealing with the integrated commonality analysis to determine the operation/tool combination that causes the integration errors in the manufacturing process is highly desired.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE INVENTION

An illustrative embodiment of the invention is described below. It will be appreciated that in the design of any such actual implementation, numerous implementation specific decisions must be made to achieve the designers' specific goals, such as compliance with manufacturing- and business-related constraints, which will vary from one implementation to another.

This invention utilizes the traditional commonality analysis on the wafer test data. After the failure signatures of all the wafers or wafer lots are determined, the traditional commonality analysis help shows the wafer defective rate for each tool of each operation.

Figure 1:
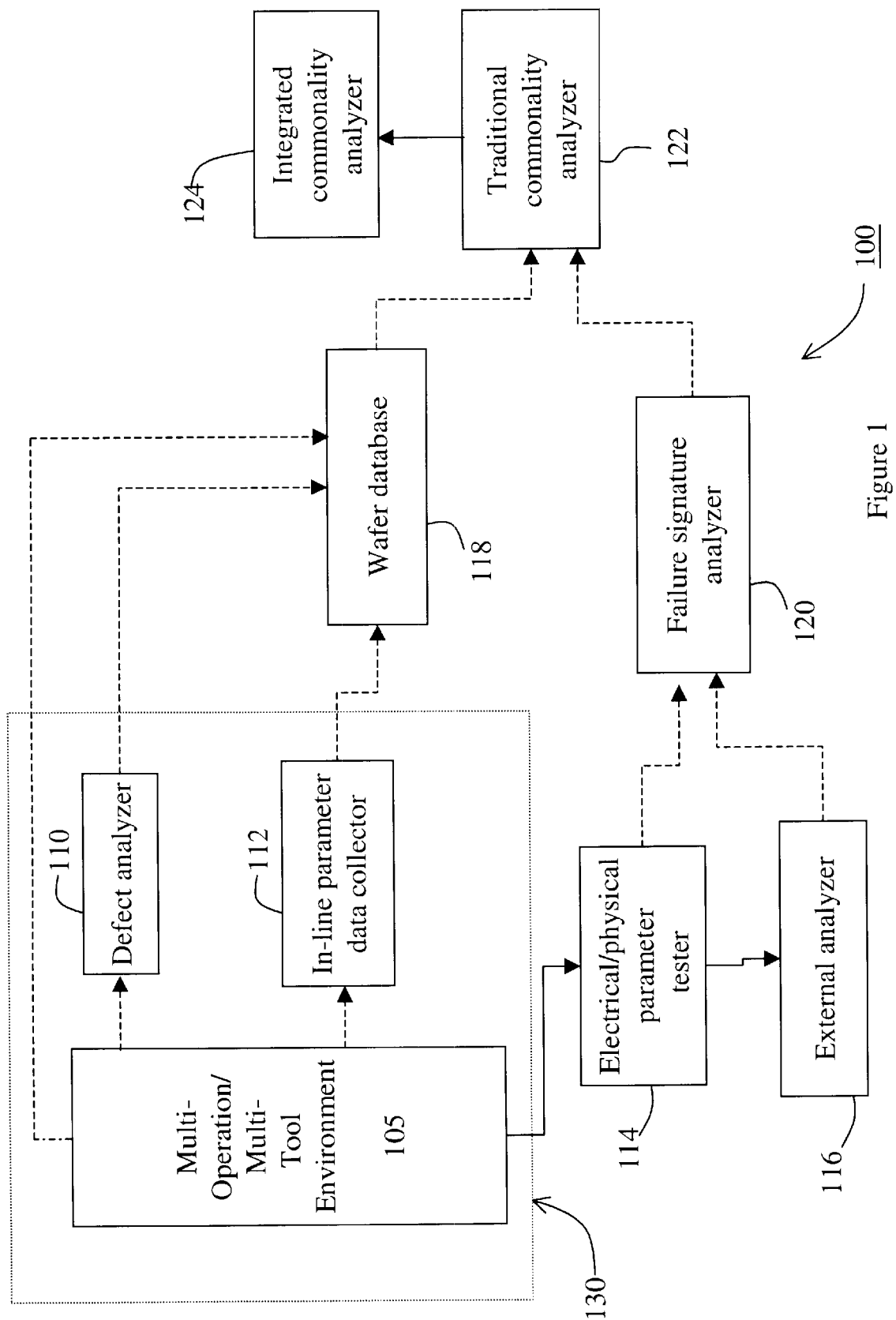
FIG. 1 shows a system block diagram of the present invention.

Referring to FIG. 1, a semiconductor processing system 100 incorporating the present invention is shown. The system 100 includes a fab 130, an electrical/physical parameter tester 114, an external analyzer 116, a wafer processing database 118, a failure signature analyzer 120, a traditional commonality analyzer 122 and an integrated commonality analyzer 124. The system 100 may also include a wafer sort machine in addition to the electrical/physical parameter tester 114 to assist in electrical testing. The fab 130 may be a semiconductor fabrication plant that manufactures integrated circuits on semiconductor wafers. The fab 130 includes a multi-operation, multi-tool environment 105, a defect analyzer 110, and an in-line parameter data collector 112. FIG. 1 is a simplified diagram of a representative fab.

The defect analyzer 110 analyzes wafers processed by the multi-operation/multi-tool environment 105, and informs an operator to adjust the tools if defects are found. The data collected by the defect analyzer 110 is sent to and stored in the wafer database 118 for further analysis. The in-line parameter data collector 112 collects data from the multi-operation/multi-tool environment 105, such as data relating to oxide thickness, depth of etch-back, and certain critical device dimensions, etc. This data is also sent to and stored in the wafer database 118. The configuration of the fab is used as illustration only.

The multi-operation/multi-tool environment 105 also sends the "begin" and "end" time during which a wafer is processed by the tool to wafer database 118. In this way, which tool processed which wafer, and when the tool processed the wafer can all be determined from the data stored in the wafer database 118. The wafer database 118 also contains information on the lot number of each wafer. Typically, the wafers are sent through the tools in a "lot" container having about 25 wafers. Thus, an operator can determine which tool was processing a particular wafer or lot at any given time from the information stored in the database.

The electrical/physical parameter tester 114 tests electrical parameters of each die on a wafer for defects. The test data may be then sent to the failure signature analyzer 120. The external analyzer 116 may include a microscope operated by an operator to spot fault patterns on a wafer by visual inspection. The external analyzer 116 could also be a pattern recognition machine capable of analyzing video images of the wafer. The data collected by the external analyzer 116 is also sent to the failure signature analyzer 120.

The failure signature analyzer 120 determines the failure signatures of the wafers from the test results generated by the electrical/physical parameter tester 114 and external analyzer 116. The failure signature analyzer 120 may generate a wafer map from the test data gathered by the electrical/physical parameter tester 114 and external analyzer 116, and find the failure signature using a pattern recognition method. The failure signature analyzer 120 may also compare the test data with a predefined failure signature database. Each different failure signature represents a particular defect pattern, and may be related to a particular kind of defect caused by a particular process or by a particular tool. For example, a defect pattern having curvilinear features may resemble a mechanical scratch, and may indicate that the tools used to polish the wafer may be defective. A defect pattern showing a grouping of low-density, sparse structures into amorphous clusters resembles the trail off of a teardrop shaped stain, and may indicate that certain liquids are contaminated with particles.

The traditional commonality analyzer 122 collects the data from the failure signature analyzer 120 and wafer database 118 to show the wafer defective rate for each tool in each operation.

The integrated commonality analyzer 124 is used to determine which pair of operation/tool in combination caused the failure signature as determined by the failure signature analyzer 120. The integrated commonality analysis described below can be used to find the operation/tool combination that caused the integration errors. After the tools are found, they can be adjusted to improve yield rate.

For purpose of illustration, assume that a semiconductor manufacturing process utilizes 6 operations, and that each operation utilizes the tools shown in Table 1.

TABLE 1

| Operation # | Tools used in the operation |
| --- | --- |
| Operation #1 | Tool A, Tool B |
| Operation #2 | Tool C, Tool D, Tool E |
| Operation #3 | Tool F |
| Operation #4 | Tool G, Tool H, Tool I |
| Operation #5 | Tool J |
| Operation #6 | Tool K, Tool L |

As shown in Table 1, Operation 1 utilizes Tool A and Tool B; Operation 2 utilizes Tool C, Tool D, and Tool E; Operation 3 utilizes Tool F, and so on. When the wafer lots are processed by these tools, each of the tools send the "begin" and "end" time during which a wafer is processed by the tool to wafer database 118. In this way, even if multiple tools are utilized in a certain operation, which tool processed which wafer, and when the tool processed the wafer can all be determined from the data stored in the wafer database.

When a certain failure signature occurs in a number of wafers, information from the wafer database is retrieved to generate lot lists that represent the sequence of wafer lots that were processed by the operation/tool during a certain "begin" and "end" time. A lot list specifies the sequence in which the wafer lots are processed by a particular tool. Some of the wafer lots in this lot list will have the failure signature, but normally not all of the wafer lots will have the failure signature. In the example above, because twelve tools were utilized, twelve lot lists will be generated. Also, a weight value is assigned to each lot in the lot list. Typically, the wafer lots without the failure signature are assigned negative weight values, such as −1, and the wafer lots having the failure signature are assigned positive weight values, such as 5. The weight values could vary according to application, but normally the absolute value for the positive weight value is larger than that of the negative weight value. We can take all the operation/tool combinations for integrated analysis. However, for purpose of efficiency illustration, we generate the candidate operation/tool list by selecting the operation/tool's that are more likely to cause the failure.

For example, assume that operation #5 (Tool J) and operation #6 (Tool K and Tool L), due to the traditional commonality analysis or from past experience, are unlikely to generate failure, then they can be removed from consideration in the integrated commonality analysis. Further, assume that the traditional commonality analysis determined that Tool B of Operation #1, Tool E of Operation #2, Tool F of Operation #3, and Tool G of Operation #4 have historically been found to have higher wafer defect rates. These tools are then were likely candidates that could have produced the failure signature. The operation/tool list including the likely candidates is designated the "Candidate Operation/Tool List". In this example, initially the "Candidate Operation/Tool List" includes Operation #1/Tool B, Operation #2/Tool E, Operation #3/Tool F, and Operation #4/Tool G.

Next, there is an option to exclude the single tool operation from the integrated commonality analysis. The remaining operations under consideration are shown in Table 2. Because Operations #3, #5, and #6 are excluded from consideration, the Candidate Operation/Tool List is left with only Operation #1/Tool B, Operation #2/Tool E, and Operation #4/Tool G.

Define the lot lists for Operation #1/Tool B, Operation #2/Tool E and Operation #4/Tool G as Lot List B, Lot List E, and Lot List G.

TABLE 2

| Operation # | Tool |
| --- | --- |
| Operation #1 | Tool B |
| Operation #2 | Tool E |
| Operation #4 | Tool G |

To determine the strength of coupling between any two tools among the Candidate Operation/Tool List, each operation/tool is in turn selected as the primary operation/tool. The remaining tools are in turn selected as the secondary operation/tool. Assume that initially operation #1/Tool B is selected as the primary operation/tool, and Operation #2/Tool E is selected as the secondary operation/tool. Lot List B includes the wafer lots that were processed by operation #1/Tool B during a certain "begin" and "end"

period. Lot List E includes the wafer lots processed by operation #2/Tool E during that same period. A Lot List EB is generated by taking the Lot List E and removing the lots that do not belong to Lot List B. Thus, Lot List EB represents the wafer lots that are processed by both Tools E and B. The cumulative value for Lot List EB is generated by sequentially summing the weight values of the wafer lots in the Lot List EB, and keeping the cumulative value above or equal to zero. The peak cumulative value is the maximum of the cumulative value generated during the summation process. In this example, the cumulative value is designated as Max_$B_E$. The greater the value of Max_$B_E$, the greater the contribution to the failure signature by the combination of Tools B and E.

TABLE 3

| Primary Secondary | Tool B | Tool E | Tool G |
|---|---|---|---|
| Tool B | N/A | Max_$E_B$ | Max_$G_B$ |
| Tool E | Max_$B_E$ | N/A | Max_$G_E$ |
| Tool G | Max_$B_G$ | Max_$E_G$ | N/A |

Shown in Table 3 are the peak cumulative values for various combinations of primary/secondary operation/tool's. After Max_$B_E$ is calculated, as the same manner of taking operation #1/Tool B as the primary tool, operation #4/Tool G is selected as the secondary operation/tool. Lot List GB is generated by taking Lot List G and removing the lots that are not in Lot List B. The cumulative value for Lot List GB is generated by summing the weight values of the wafer lots in Lot List GB and keeping the cumulative value above or equal to zero. The peak cumulative value is designated Max_$B_G$. Next, operation #2/Tool E is selected as the primary tool, and operation #1/Tool B, operation #4/Tool G are in turn selected as the secondary operation/tool. Peak cumulative values Max_$E_B$ and Max_$E_G$ are calculated accordingly. Next, operation #4/Tool G is selected as the primary operation/tool, and Max_$G_B$ and Max_$G_E$ are calculated accordingly.

Usually, Max_$B_E$ will be equal to Max_$E_B$, since they are calculated from the weight values of the wafer lots that passed through both operation/tool's. However, sometimes due to WIP (Work In Process) mixing, the lot sequences of Lot List BE and Lot List EB may be slightly different thus cause the two peak cumulative values, Max_$B_E$ and Max_$E_B$, different. Therefore it is more accurate to consider the value (Max_$B_E$+Max_$E_B$) as the indicator to the strength of contribution to the failure signature by both operation #1/Tool B and operation #2/Tool E. Define the peak combination cumulative value of operation/Tool's X and Y as the sum of Max_$X_Y$ and Max_$Y_X$:

Combined_Max_BE=(Max_$B_E$+Max_$E_B$);

Combined_Max_BG=(Max_$B_G$+Max_$G_B$);

and

Combined_Max_EG=(Max_$E_G$+Max_$G_E$).

The pair of operation/tool's with the maximum peak combination cumulative value is the pair of operation/tool's that are most likely to cause the failure signature. As an example, if Combined_Max_BE has the greatest value among the three peak combination cumulative values described above, operation #1/Tool B and operation #2/Tool E, in combination, are the operation/tool's that are most likely to generate the failure signature.

Figure 2:
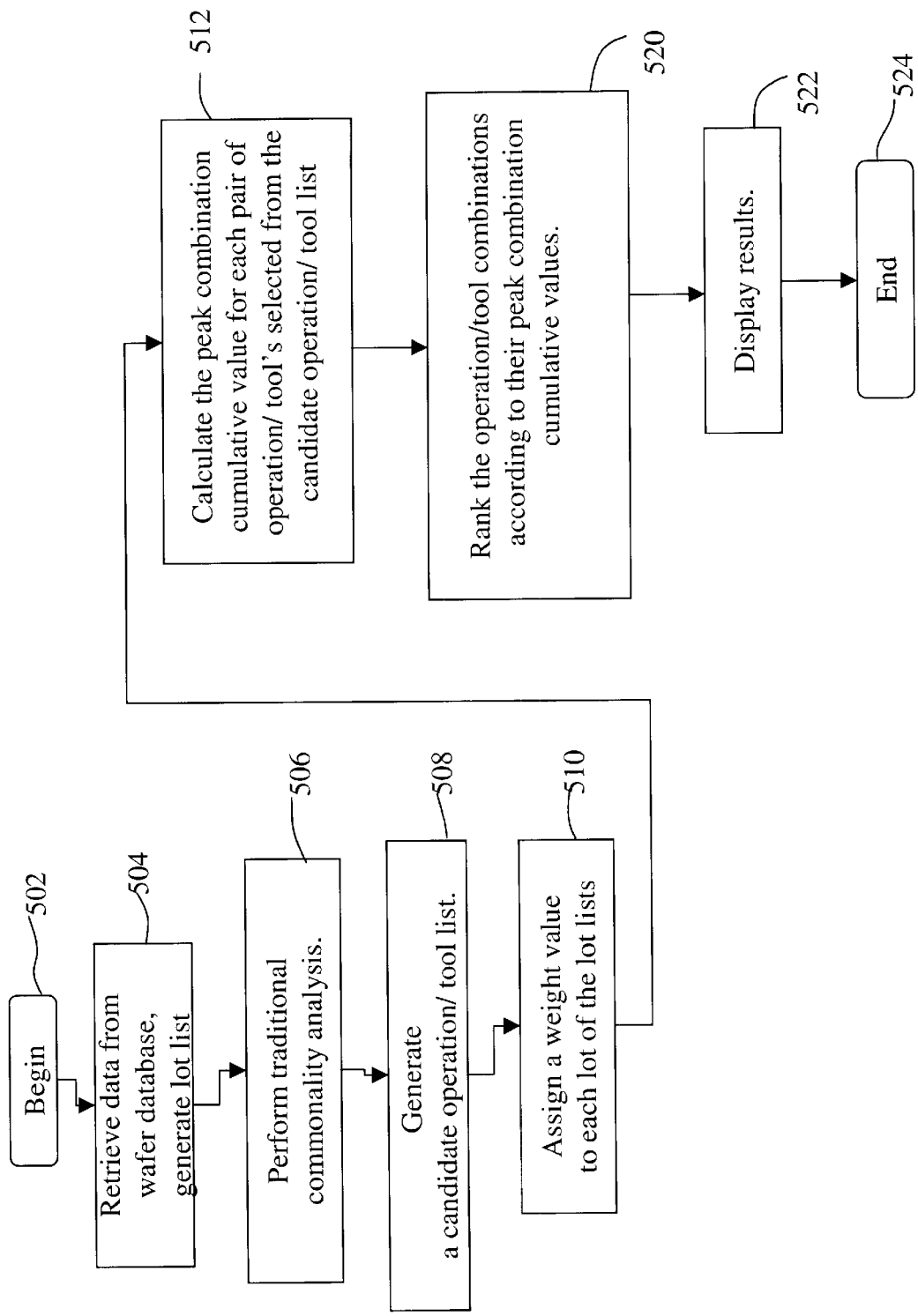
FIG. 2 shows a flowchart of the process used by the present invention.

FIG. 2 shows a flow diagram of a method for performing the integrated commonality analysis according to the present invention. The method begins in box 502. In box 504, relevant data is retrieved from the wafer database for wafer lots that are processed during a certain time frame and in which certain lots have a particular failure signature. A lot list is generated for each tool under consideration. In box 506, the traditional commonality analysis is performed to find a number of operation/tool's that are likely to have caused the failure signature. In box 508, generate the candidate operation/tool list for integration commonality analysis. For less complicated fabrication environment, we may choose all the operation/tool's combinations as the candidate operation/tool list. However, in complicated fabrication environment and for efficiency consideration, we may generate the candidate operation/tool list by selecting the operation/tool's that are more likely to cause failures. Single tool operations may also be excluded in this step.

In box 510, assign a weight value to each lot of the lot list for each operation/tool in the candidate operation/tool list, with good lots negative values, for example −1, and bad lots possitive values, for example 5. The weight values may vary according to the judgement of the engineer, however, the absolute value of the positive weight value should be larger than that of the negative weight value.

In box 512, for each pair of operation/tool's selected from said candidate operation/tool list, calculate the peak combination cumulative value as follows.

Name one of said pair of operation/tool's as the primary operation/tool who's lot list is named as the primary lot list, and name the other of said pair of operation/tool's as the secondary operation/tool whose lot list is named as secondary lot list.

Generate a first lot list by removing the lots that are not in said primary lot list from said secondary lot list, and generate a second lot list by removing the lots that are not in said secondary lot list from said primary lot list.

Generate a first cumulative value by sequentially summing the weight value of each lot in said first lot list and keeping the cumulative value above or equal to zero. The peak cumulative value is found by recording the maximum cumulative value in the summation process.

Then as the same manner, generate a second cumulative value by sequentially summing the weight value of each lot in said second lot list, and assigning a second peak cumulative value as the maximum second cumulative value during the summation process.

Finally, sum up said first peak cumulative value and said second peak cumulative value to make a peak combination cumulative value for each pair of operation/tool's in the candidate operation/tool list.

In box 520, the operation/tool's are ranked according to their peak combination cumulative values. The pair of tools with the greatest peak combination cumulative value is the most likely pair of tools that caused the failure signature. By adjusting the pair of operation/tool's with the largest peak combination cumulative value, the occurrence of the failure signature would be reduced most effectively, and the yield rate would be increased most effectively. In box 522, the results of the analysis are displayed as graphic charts showing the cumulative values versus the lot sequence, accompanied with operation/tool identifications, yield rates, etc. And the method ends in box 524.

While the preferred embodiment of the invention has been illustrated and described, it will be appreciated that various changes can be made therein without departing from the spirit and scope of the invention.

I claim:

1. A method for finding a pair of operation/tool's for a failure in a semiconductor fabrication facility having multiple operations and multiple tools for processing a plurality of semiconductor wafer lots, wherein each operation/tool having a lot list representing the process sequence of the lots, and a lot with wafers having the failure is called a bad lot, and a lot without the failure is called a good lot, the method comprising:

generating a candidate operation/tool list by selecting all the operation/tool's;

assigning a weight value to each lot in the lot list for each operatioon/tool in said candidate operation/tool list, the weight value being a predetermined positive value for a bad lot, and a negative value for a good lot;

selecting a pair of operation/tool's from said candidate operation/tool list;

for said pair of operation/tool's, naming one of said pair of operation/tool's as the primary operation/tool whose lot list is named as the primary lot list; naming the other of said pair of operation/tool's as the secondary operation/tool whose lot list is named as the secondary lot list;

generating a first lot list by removing the lots that are not in said primary lot list from said secondary lot list; generating a second lot list by removing the lots that are not in said secondary lot list from said primary lot list;

generating a first cumulative value by sequentially summing the weight value of each lot in said first lot list, and assigning a first peak cumulative value as the maximum first cumulative value during the summation process;

generating a second cumulative value by sequentially summing the weight value of each lot in said second lot list, and assigning a second peak cumulative value as the maximum second cumulative value during the summation process;

summing said first peak cumulative value and said second peak cumulative value to make a peak combination cumulative value;

ranking each pair of operation/tool's according to their corresponding peak combination cumulative values; and assigning the pair of operation/tool's with the greatest peak combination cumulative value the most likely to cause said failure.

2. The method of claim 1, wherein generating the candidate operation/tool list further includes selecting the operation/tool's that have higher wafer defect rates than the others.

3. The method of claim 2, wherein generating said candidate operation/tool list further includes the step of excluding from said candidate tool list single tool operations.

4. The method of claim 1, wherein the absolute value of said positive weight value is larger than the absolute value of said negative weight value.

5. The method of claim 1, wherein the step of generating a cumulative value sequentially sums the weight values of each lot in the corresponding lot list, keeping the cumulative value not less than zero during the summation process, and assigning a peak cumulative value as the maximum cumulative value during the summation process.

6. A method for finding a pair of operation/tool's in a semiconductor fabrication facility having a plurality of tools for processing a plurality of semiconductor wafer lots, the method comprising the steps of:

performing a series of wafer processing steps on the plurality of wafer lots with the plurality of tools;

generating a database having data representative of the time during which each wafer lot passed through each of said plurality of tools;

testing the plurality of wafer lots to determine whether a wafer lot is associated with a failure signature;

generating a candidate operation/tool list, selecting operation/tool's with higher defect wafer rates;

assigning a weight value to each lot in a lot list for each operatioon/tool in said candidate operation/tool list, the weight value being a predetermined positive value for a bad lot, and a negative value for a good lot;

performing an integrated commonality analysis for calculating a peak combination cumulative value for each pair of operation/tool's among said candidate operation/tool list, and finding a pair of operation/tool's with the greatest peak combination cumulative value; and designating said pair of operation/tool's with the greatest peak combination cumulative value as the pair of operation/tool's that are most likely to cause said failure signature.

7. The method of claim 6, wherein said integrated commonality analysis includes the steps of:

selecting a pair of operation/tool's from said candidate operation/tool list;

for said pair of operation/tool's, naming one of said pair of operation/tool's as the primary operation/tool whose lot list is named as the primary lot list; naming the other of said pair of operation/tool's as the secondary operation/tool whose lot list is named as the secondary lot list;

generating a first lot list by removing the lots that are not in said primary lot list from said secondary lot list; generating a second lot list by removing the lots that are not in said secondary lot list from said primary lot list;

generating a first cumulative value by sequentially summing the weight value of each lot in said first lot list, and assigning a first peak cumulative value as the maximum first cumulative value during the summation process;

generating a second cumulative value by sequentially summing the weight value of each lot in said second lot list, and assigning a second peak cumulative value as the maximum second cumulative value during the summation process;

summing said first peak cumulative value and said second peak cumulative value to make a peak combination cumulative value; and ranking each pair of operation/tool's according to their corresponding peak combination cumulative values.

8. The method of claim 6, wherein generating said candidate operation/tool list further includes the step of excluding from said candidate tool list single tool operations.

9. A defective tool detection system used in connection with a fabrication facility having a plurality of tools for processing semiconductor wafers that are grouped into a plurality of wafer lots, comprising:

an electrical parameter tester for receiving the wafer lots and identifying defects on each wafer of the wafer lots;

a failure signature analyzer for identifying a failure signature representative of defect patterns on the wafers having defects;

a memory for storing a set of data representative of the time during which each wafer passed through each tool in the fabrication facility; and an integrated commonality analyzer for receiving said set of data stored in said memory and said failure signature from said fail signature analyzer in order to calculate a peak combination cumulative value for each pair of operation/tool's, determine a pair of operation/tool's with the greatest peak combination cumulative value, and designate said pair of operation/tool's the most likely to cause said failure signature.

10. The defective tool detection system of claim 9, wherein said intergrated commonality analyzer performs the following steps:

generating a candidate operation/tool list by selecting a plurality of operation/tool's that are likely to cause said failure;

assigning a weight value to each lot in a lot list for each operatioon/tool in said candidate operation/tool list, the weight value being a predetermined positive value for a bad lot, and a negative value for a good lot;

selecting a pair of operation/tool's from said candidate operation/tool list;

for said pair of operation/tool's, naming one of said pair of operation/tool's as the primary operation/tool whose lot list is named as the primary lot list; naming the other of said pair of operation/tool's as the secondary operation/tool whose lot list is named as the secondary lot list;

generating a first lot list by removing the lots that are not in said primary lot list from said secondary lot list; generating a second lot list by removing the lots that are not in said secondary lot list from said primary lot list;

generating a first cumulative value by sequentially summing the weight value of each lot in said first lot list, and assigning a first peak cumulative value as the maximum first cumulative value during the summation process;

generating a second cumulative value by sequentially summing the weight value of each lot in said second lot list, and assigning a second peak cumulative value as the maximum second cumulative value during the summation process;

summing said first peak cumulative value and said second peak cumulative value to make a peak combination cumulative value;

ranking each pair of operation/tool's according to their corresponding peak combination cumulative values; and assigning the pair of operation/tool's with the greatest peak combination cumulative value the most likely to cause said failure.

11. The defective tool detection system of claim 10, wherein generating the candidate operation/tool list further includes selecting the operation/tool's that have higher wafer defect rates than the others.

12. The defective tool detection system of claim 11, wherein generating said candidate operation/tool list further includes the step of excluding from said candidate tool list single tool operations.

13. The defective tool detection system of claim 10, wherein wafer lots having wafers with said failure signature are assigned a positive weight value, and wafer lots not having wafers with said failure signature are assigned a negative weight value.

14. The defective tool detection system of claim 10, wherein the absolute value of said positive weight value is larger than the absolute value of said negative weight value.

15. The defective tool detection system in claim 10, further comprising an output display for displaying a graphic plot of the cumulative values versus the lot numbers.

* * * * *